United States Patent
Cho et al.

(10) Patent No.: US 7,291,531 B2
(45) Date of Patent: Nov. 6, 2007

(54) METHOD OF FABRICATING SEMICONDUCTOR DEVICE HAVING CAPACITOR

(75) Inventors: Sung-Il Cho, Seoul (KR); Seung-Young Son, Yongin-si (KR); Chang-Jin Kang, Suwon-si (KR); Kyeong-Koo Chi, Seoul (KR); Ji-Chul Shin, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 451 days.

(21) Appl. No.: 11/048,995

(22) Filed: Feb. 2, 2005

(65) Prior Publication Data

US 2005/0130371 A1 Jun. 16, 2005

Related U.S. Application Data

(62) Division of application No. 10/855,165, filed on May 27, 2004, now Pat. No. 6,867,096.

(30) Foreign Application Priority Data

Jun. 25, 2003 (KR) ............................. 2003-41449

(51) Int. Cl.
*H01L 21/8242* (2006.01)

(52) U.S. Cl. ...................................... 438/253; 438/396

(58) Field of Classification Search ................ 438/253, 438/396
See application file for complete search history.

(56) References Cited

U.S. PATENT DOCUMENTS 5,899,716 A * 5/1999 Tseng .......................... 438/254

FOREIGN PATENT DOCUMENTS

KR 2003-0001917 1/2003

OTHER PUBLICATIONS

Korean Patent Abstracts for Publication No. 2003-0001917.

* cited by examiner

*Primary Examiner*—Jack Chen
(74) *Attorney, Agent, or Firm*—F. Chau & Associates, LLC

(57) ABSTRACT

Methods are provided for fabricating semiconductor devices having capacitors, which prevent lower electrodes of the capacitors from breaking or collapsing and which provide increased capacitance of the capacitors. For instance, a method includes forming a first insulating layer on a semiconductor substrate, forming a first hole in the first insulating layer, forming a contact plug in the first hole, forming a second insulating layer having a landing pad, wherein the landing pad contacts an upper surface of the contact plug, forming an etch stop layer on the landing pad and the second insulating layer, forming a third insulating layer on the etch stop layer; forming a third hole through the third insulating layer and etch stop layer to expose the landing pad, selectively etching the exposed landing pad, forming a lower electrode on the selectively etched landing pad, and then forming a capacitor by forming a dielectric layer and an upper electrode on the lower electrode.

8 Claims, 7 Drawing Sheets

METHOD OF FABRICATING SEMICONDUCTOR DEVICE HAVING CAPACITOR

CROSS-REFERENCE TO RELATED APPLICATION

This application is a Divisional of U.S. patent application Ser. No. 10/855,165 filed on May 27, 2004, now U.S. Pat. No. 6,867,096 which claims priority to Korean Patent Application No. 2003-41449, filed on Jun. 25, 2003, the disclosures of which are fully incorporated herein by reference.

TECHNICAL FIELD OF THE INVENTION

The present invention relates to methods for fabricating semiconductor devices with capacitors having increased capacitance, and more particularly, to methods for fabricating capacitors, which prevent the collapse of lower capacitor electrodes and which provide increased capacitance.

BACKGROUND

Due to a continual increase in the integration density of semiconductor devices such as dynamic random access memories (DRAMs), various methods have been considered for obtaining sufficient cell capacitance in a limited area. For example, methods for providing sufficient cell capacitance include, e.g., using a dielectric material having a high dielectric constant as a dielectric layer of a capacitor, reducing the thickness of the dielectric layer, or increasing an effective area of a lower electrode.

Among these conventional methods, the use of a material having a high dielectric constant requires time and money for introducing new equipment, verifying reliability, mass producing the dielectric layer, and lowering the temperature of subsequent processes. Therefore, the method of increasing the effective area of the lower electrode is more favorable since a conventional dielectric layer can still be used where the manufacturing process is relatively easy to employ.

There are also several methods that can be implemented for increasing the effective area of a lower electrode for a capacitor. For instance, the lower electrode can be made to be three dimensional, for example, a cylinder-type or fin-type, and the height of the lower electrode can be increased. The process of shaping the lower electrode to be three dimensional and cylindrical has an advantage in obtaining a sufficient storage space for an electric charge. However, with an OCS (one cylinder storage) structure, for example, the height of the lower electrode must be increased to obtain a capacitance that is sufficient to enable operation of the device. For this purpose, a mold oxide thickness must be increased, and subsequently, a critical dimension (CD) of a bottom portion of a storage node hole in which the lower electrode is formed becomes smaller due to the sloping side wall that results when etching the storage node hole. Accordingly, the semiconductor device has an unstable shape with the lower electrode having a narrow lower portion. In addition, with such structure, the lower electrode is likely to collapse due to the occurrence of surface tension when removing the mold oxide by wet etching after forming the lower electrode in the storage node hole and drying is performed. Moreover, the weak lower electrode is likely to collapse or break due to thermal stress in subsequent processes. Consequently, the resulting semiconductor device may malfunction due to the occurrence of bridges between cells.

SUMMARY OF THE INVENTION

Exemplary embodiments of the invention generally include methods for fabricating semiconductor devices having capacitors that provide increased capacitance and which prevent the collapse or breakage of lower electrodes of the capacitors.

In one exemplary embodiment of the invention, a method for fabricating a semiconductor device comprises: forming a first insulating layer on a semiconductor substrate; forming a first hole in the first insulating layer; forming a contact plug in the first hole; forming a second insulating layer comprising a landing pad, wherein the landing pad contacts an upper surface of the contact plug; forming an etch stop layer on the landing pad and the second insulating layer; forming a third insulating layer on the etch stop layer; forming a third hole through the third insulating layer and etch stop layer to expose the landing pad; selectively etching the exposed landing pad; forming a lower electrode on the selectively etched landing pad; and forming a capacitor by forming a dielectric layer and an upper electrode on the lower electrode.

Furthermore, the step of forming the second insulating layer may include: forming a second insulating layer on the contact plug and the first insulating layer; forming a second hole through second insulating layer to expose the contact plug and a portion of the first insulating layer surrounding the contact plug; and forming a landing pad in the second hole. Alternatively, the step of forming the second insulating layer may include: forming a landing pad on an upper surface of the contact plug; forming a second insulating layer covering the landing pad on the first insulating layer; and exposing an upper surface of the landing pad by planarizing the second insulating layer.

In another exemplary embodiment of the invention, a method of fabricating a semiconductor device comprises: forming a first insulating layer on a semiconductor substrate; forming a contact hole in the first insulating layer; forming a contact plug with doped polysilicon in the contact hole; forming an etch stop layer on the contact plug and the first insulating layer; forming a second insulating layer on the etch stop layer; forming a storage node hole through the second insulating layer and the etch stop layer to expose the contact plug; selectively etching the exposed contact plug using a mixture of HBr and $Cl_2$, and Ar plasma; forming a lower electrode on the selectively etched contact plug; and forming a capacitor by forming a dielectric layer and an upper electrode on the lower electrode. With this exemplary method, a portion from where the landing pad or contact plug is partially removed is used as a lower portion of the capacitor by forming the lower electrode after selectively etching the landing pad or the contact plug. Therefore, the capacitance of the capacitor can be increased. Furthermore, tilting of the lower electrode can be lessened due to enhanced support of the lower electrode by forming the lower electrode inside the landing pad or the contact plug.

These and other exemplary embodiments, aspects, objects, features and advantages of the present invention will be described or become apparent from the following detailed description of exemplary embodiments thereof, which is to be read in connection with the accompanying drawings.

DETAILED DESCRIPTION OF EXEMPLARY EMBODIMENTS

Hereinafter, exemplary embodiments of the present invention will be described more fully with reference to the accompanying drawings. These exemplary embodiments are provided so that this disclosure will be thorough and complete, and will fully convey concepts of the invention to one of ordinary skill in the art. However, one of ordinary skill in the art could readily envision other embodiments of the invention and nothing herein should be construed as limiting the scope of the invention. Further, it is to be understood that the drawings are schematic representations where the thickness of layers and regions are exaggerated for clarity. Moreover, the same reference numerals throughout the drawings may represent the same or similar elements, and thus their description may be omitted.

Figure 1:
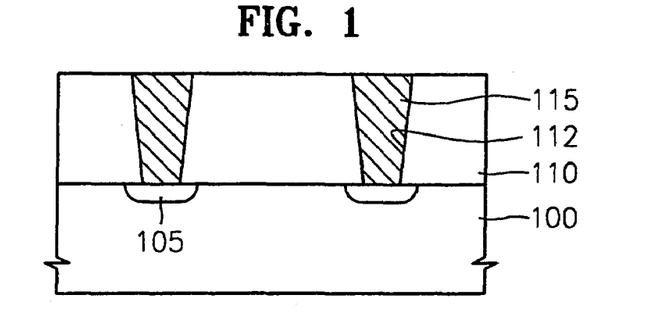
FIGS. 1 through 7 are schematic cross-sectional views illustrating a method for fabricating a semiconductor device according to an exemplary embodiment of the present invention.

FIGS. 1 through 7 are schematic cross-sectional views illustrating a method for fabricating a semiconductor device according to an exemplary embodiment of the present invention. Referring initially to FIG. 1, a semiconductor device comprises a semiconductor substrate 100 having doped regions 105 formed therein and a first insulating layer 110 formed on the substrate 100. The first insulating layer 110 may comprise a boron phosphorus silicate glass (BPSG) layer, a spin on glass (SOG) layer, an undoped silicate glass (USG) layer, or a flowable oxide (FOX, Si—O—H class) layer. Alternatively, a silicon oxide layer can be deposited using a high density plasma-chemical vapor deposition (HDP-CVD) method. In addition, a tetraethylorthosilicate (TEOS) layer or a $SiH_4$ layer can be formed using plasma.

A plurality of first holes 112 are formed by etching the first insulating layer 110 over doped regions 105. Then, contact plugs 115 are formed in the first holes 112 by depositing a layer of conductive material. More specifically, by way of example, the contact plugs 115 can be formed by depositing a layer of doped polysilicon to fully fill the first holes 112, and then planarized down to the surface of the first insulating layer 110.

Figure 2:
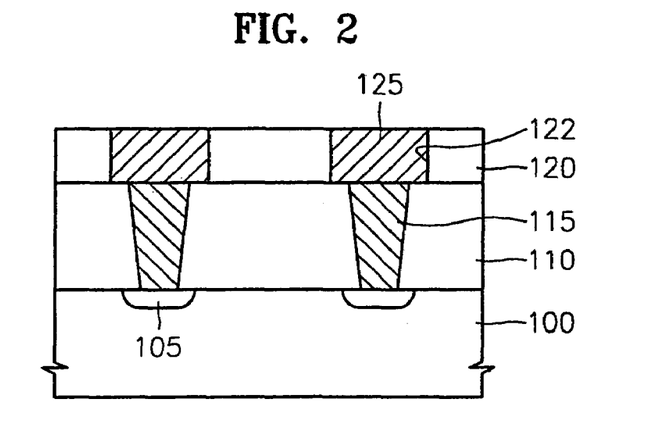

Referring now to FIG. 2, a second insulating layer 120 is formed on the contact plugs 115 and the first insulating layer 110. The second insulating layer 120 may be a BPSG layer, a SOG layer, a USG layer, a FOX layer, a silicon oxide layer formed by HDP-CVD, a TEOS layer, or a $SiH_4$ layer formed by plasma. Next, second holes 122 are formed in the second insulating layer 120 to expose the contact plugs 115, and then landing pads 125 are formed in the second holes 122. The landing pads 125 are formed wider than the contact plugs 115 since the second holes 122 are formed to expose the contact plugs 115 and a portion of the surface of the first insulating layer 110 surrounding the contact plugs 115. The landing pads 125 connect the contact plugs 115 to a lower electrode (not shown). The landing pads 125 are preferably made of doped polysilicon. For instance, polysilicon can be deposited using a conventional low pressure chemical vapor deposition (LPCVD) method, and then converted to n-type doped polysilicon by performing a PH3 doping on the polysilicon to secure low specific resistivity. That is, an in-situ doping is simultaneously performed with the depositing of the polysilicon.

In one exemplary embodiment, the second insulating layer 120 is formed first, and the landing pads 125 are subsequently formed. In another exemplary embodiment, however, the landing pads 125 connected with the upper surfaces of the contact plugs 115 may be formed first, and then the second insulating layer 120 may be planarized so that the upper surface of the landing pads 125 are exposed.

Figure 3:
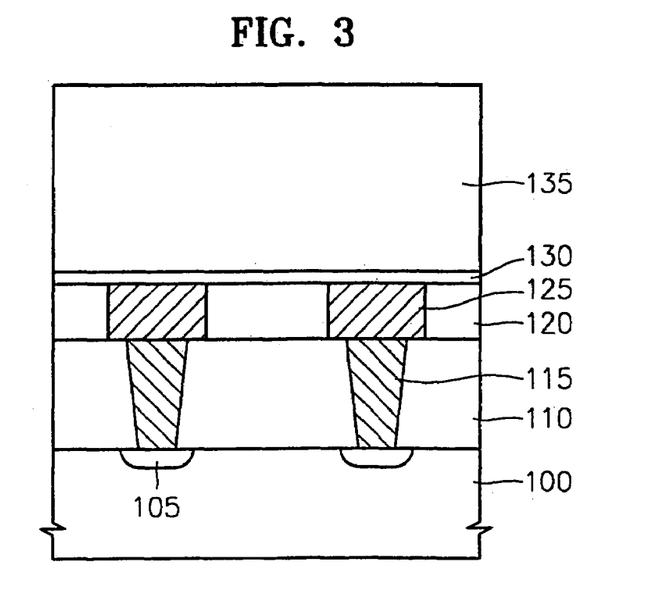

Referring now to FIG. 3, an etch stop layer 130 is formed on the landing pads 125 and the second insulating layer 120. Then, a third insulating layer 135 is formed on the etch stop layer 130. In one embodiment, the etch stop layer 130 is made of a silicon nitride and the third insulating layer 135 is made of, e.g., a silicon oxide such as a BPSG layer, a phosphorus silicate glass (PSG) layer, a silicon oxide layer formed by HDP-CVD, or a TEOS layer using plasma. The third insulating layer 135 is used as a mold oxide layer.

Figure 4:
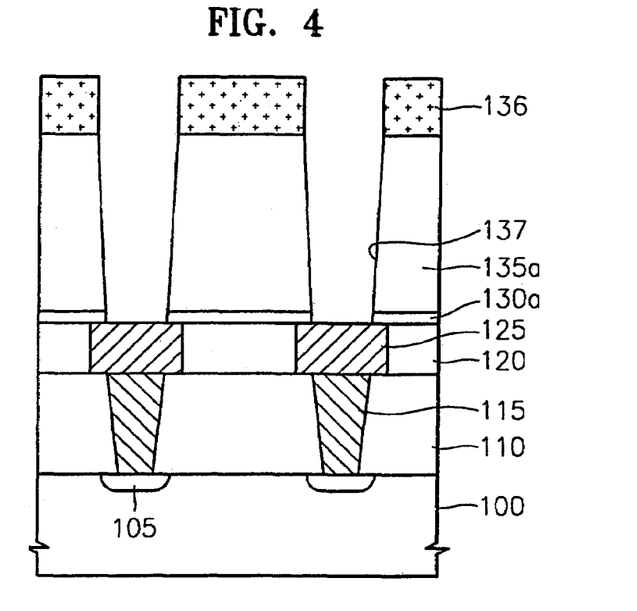

Referring now to FIG. 4, third holes 137 are formed to expose the landing pads 125 are formed by etching the third insulating layer 135 and the etch stop layer 130. More specifically, in one exemplary embodiment of the invention, a photoresist pattern 136 is formed on the third insulating layer 135. A third insulating layer pattern 135a is formed by etching the third insulating layer 135 using the photoresist pattern 136 as an etch mask to thereby expose an upper surface of the etch stop layer 130. The etch stop layer 130 protects the second insulating layer 120 from being etched. Next, the third holes 137 are formed using etch process that removes the exposed etch stop layer 130 to thereby expose the landing pads 125. An etch stop layer pattern 130a remains on a lower portion of the third insulating layer pattern 135a.

Figure 5:
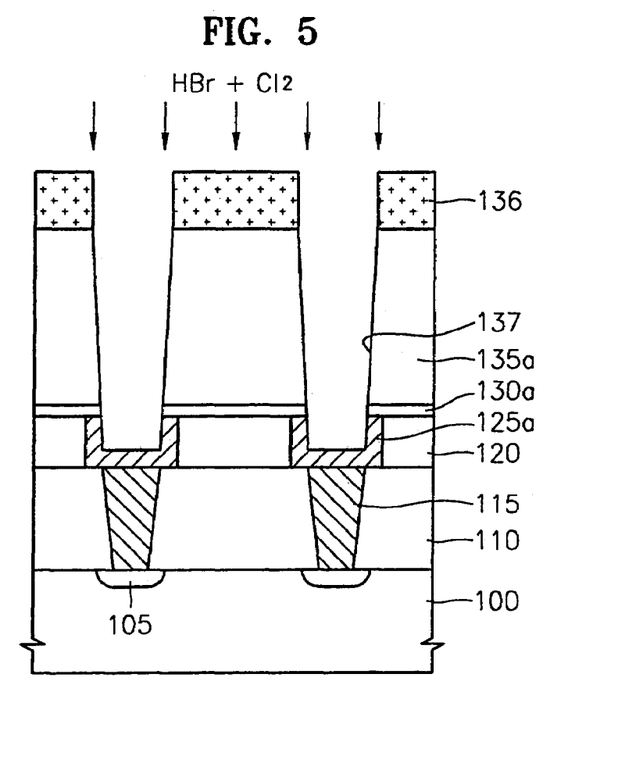

Referring now to FIG. 5, the exposed landing pads 125 are selectively etched. In one exemplary embodiment, a selectivity ratio of the landing pad 125 to one of the third insulating layer pattern 135a and the etch stop layer pattern 130a in greater than about 10:1. For instance, a mixture of HBr and $Cl_2$ can be used to obtain such etch selectivity. Further, a flow rate of HBr ranges from about 10 to about 200 sccm, a flow rate of $Cl_2$ ranges from about 5 to about 50 sccm, and a flow rate of Ar ranges from about 10 to about 300 sccm. Further, a source power of plasma is used which ranges from about 100 to about 1000 W and bias power is used which ranges from about 50 to about 300 W. The etch process can make the landing pads 125 thin in the lower portions thereof, which can lead to exposure of the contact plugs 115 located at the lower portion of the landing pads 125 by adjusting the etching time. Although the landing pads 125 can be etched to expose the contact plugs 115, the exemplary method prevents this from occurring since the etching is performed in a condition where a selectivity ratio of the landing pads 125 to the third insulating layer pattern 135a or the etch stop layer pattern 130a is greater than about 10:1.

Figure 6:
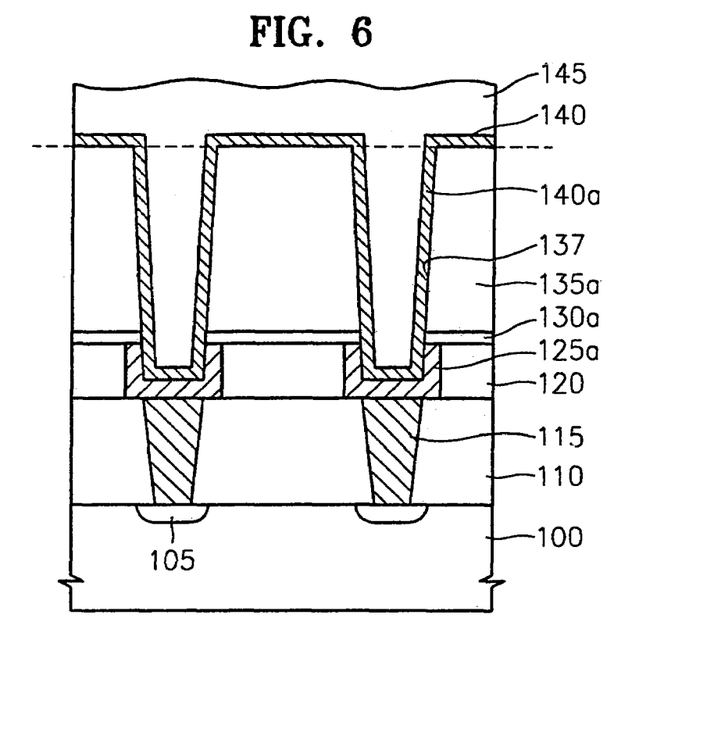

Referring now to FIG. 6, a lower electrode 140 is formed by conformally depositing a conductive layer to have a thickness that is sufficient to cover the walls of the third holes 137, but not filling the third holes 137, on the selectively etched landing pad 125a. The lower electrode 140 may be formed by depositing a layer of doped polysilicon using chemical vapor deposition (CVD) or atomic layer deposition (ALD), which provide excellent step coverage. Next, a capping layer 145 is formed over the lower electrode 140 to fully fill the third holes 137. In one exemplary embodiment, the capping layer 145 is made of a silicon oxide layer, such as a USG layer, having a good gap-filling feature. Then, the capping layer 145 and the lower electrode 140 are removed using an etch process, such as an etchback or a chemical mechanical polishing (CMP) process, for example, to expose an upper surface of the third insulating layer pattern 135a (i.e., the portion above the dotted line in FIG. 6 is removed). This process is referred to as "node separation", and results in formation of separate cylinder-type lower electrode 140a structures for capacitors.

Figure 7:
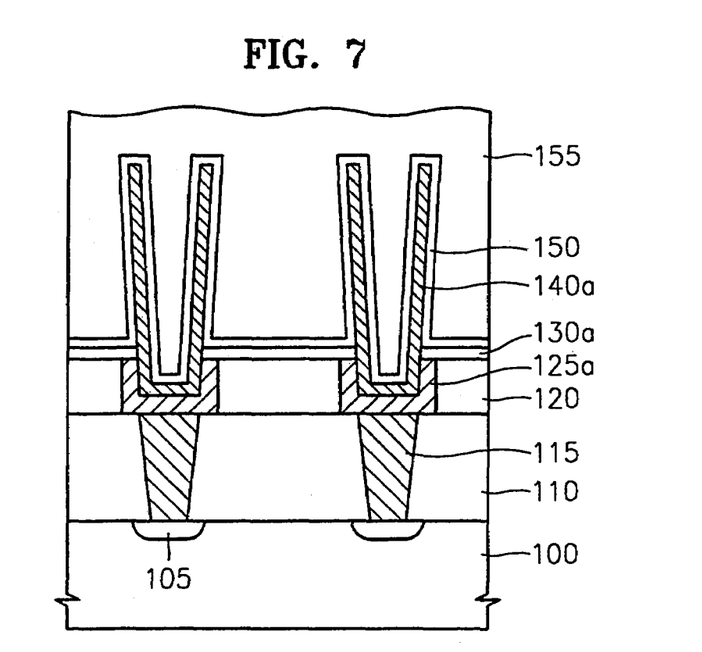

Referring now to FIG. 7, the third insulating layer pattern 135a and capping layer 145 are removed using a wet etch to expose the outer and inner sides of the cylinder-type lower electrodes 140a. Thereafter, a conformal dielectric layer 150 is formed. If necessary, plasma nitridation using a $NH_3$ gas or thermal nitridation can be performed on the surface of the lower electrodes 140a before forming the dielectric layer 150. Thereby, a silicon nitride layer ranging between 10~20 Å is formed on the lower electrodes 140a to prevent a reaction between the lower electrode 140a and the dielectric layer 150.

The dielectric layer 150 may be an $HfO_2$ layer, an $Al_2O_3$ layer, or a mixed layer of $Al_2O_3$ and $HfO_2$. A CVD or ALD process, which have excellent step coverage, may be used to form the dielectric layer 150, although ALD provides an advantage of maintaining a low deposition temperature as low as 300 degrees Celsius throughout the process. An extra process may be performed after forming the dielectric layer 150 to improve electric characteristics of the dielectric layer 150. For instance, the resulting material of the dielectric layer 150 can be processed with $O_3$ or plasma including an oxygen or nitrogen gas, or can be thermally processed with an oxygen or nitrogen gas. Next, an upper electrode 155 is formed on the dielectric layer 150. The upper electrode 155 can be formed with a doped polysilicon layer or a double layer by sequentially depositing a TiN layer and a doped polysilicon layer.

Advantageously, since the lower portion of the lower electrodes 140a are formed in the selectively etched landing pads 125a, the etch stop layer 130 supports the lower electrodes 140a at a location higher than the lower portion of the lower electrodes 140a. In addition, the area of contact is increased between the lower electrodes 140a, a second insulating layer pattern 120a, and landing pads 125a. Accordingly, the resulting structure provides support and structural integrity to the lower electrodes 140a, thereby preventing tilting of the lower electrodes 140a in a subsequent process, and the height of an OCS structure can be further increased (as compared to conventional methods) since tilting of the lower electrode 140a is lessened when forming an OCS structure according to the invention. Moreover, increased capacitance is achieved due to the enhanced height of a capacitor and a further increase in capacitance is expected since the lower electrodes 140a formed in the landing pads 125a can provide an increase in the effective area.

Figure 8:
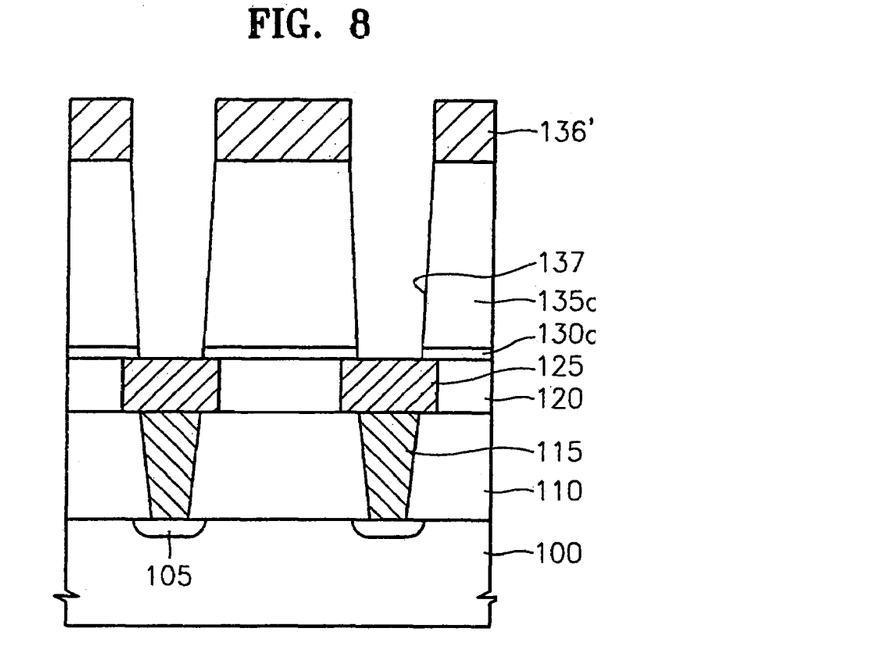
FIGS. 8 and 9 are schematic cross-sectional views illustrating a method for fabricating a semiconductor device according to another exemplary embodiment of the present invention.
Figure 9:
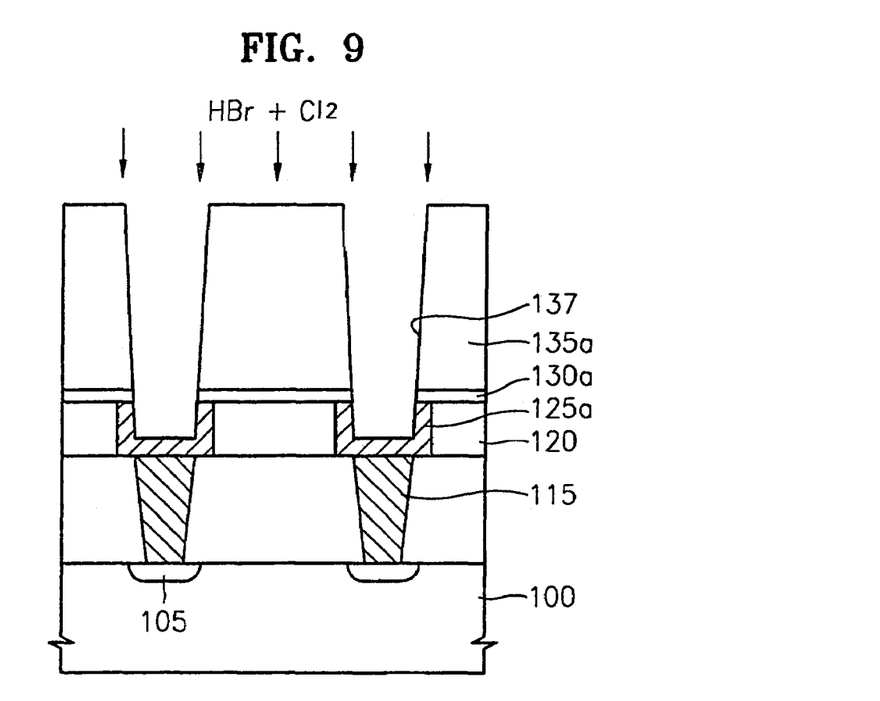

FIGS. 8 and 9 are schematic cross-sectional views illustrating a method for fabricating a semiconductor device according to another embodiment of the present invention. Initially, processing steps such as those described above with reference to FIGS. 1, 2 and 3 are performed to obtain the structure depicted in FIG. 3.

Then, referring to FIG. 8, third holes 137 are formed by etching the third insulating layer 135 and the etch stop layer 130. Next, a polysilicon hard mask 136' is formed on the third insulating layer 135, which is used as an etch mask to form the third insulating layer pattern 135a by etching the third insulating layer 135 until an upper surface of the etch stop layer 130 is exposed. The landing pads 125 are exposed by performing an etch process to remove the exposed portions of the etch stop layer 130. Thus, an etch stop layer pattern 130a remains in a lower portion of the third insulating layer pattern 135a.

Referring now to FIG. 9, the exposed landing pads 125 are selectively etched. In one exemplary embodiment, the selectivity ratio of the landing pads 125 to the third insulating layer pattern 135a or the etch stop layer pattern 130a is greater than about 10:1. In one embodiment, this etch is performed using a mixed gas of HBr and $Cl_2$ with Ar plasma. The landing pads 125 become thinner, without damaging the third insulating layer pattern 135a or the etch stop layer pattern 130a.

It is to be appreciated that because the polysilicon layer 136' is made of the same material as the landing pads 125, that is, doped polysilicon, the polysilicon hard mask layer 136' is etched away along with the exposed portions of the landing pads 125 when selectively etching the landing pads 125. In this exemplary embodiment, the pertinent process is simplified due to elimination of the added steps for removing a photoresist pattern. Furthermore, rather than having to implement an expensive CMP, an etchback is sufficient for planarizing the conductive layer for the lower electrode in the subsequent process since some degree of planarizing is realized.

The exemplary embodiment proceeds as described above with reference to FIG. 7, wherein the lower electrode 140a is formed on the selectively etched landing pads 125a, and then the dielectric layer 150 and an upper electrode 155 on the lower electrode 140a are formed.

In accordance with the exemplary embodiment, the capacitance can be increased and tilting of the lower electrode can be lessened since a part, where the landing pad is removed, is used as the lower electrode of the capacitor by forming the lower electrode of the capacitor after selectively etching the landing pad. In addition, the pertinent process can be simplified and the production cost can become cheaper.

Figure 10:
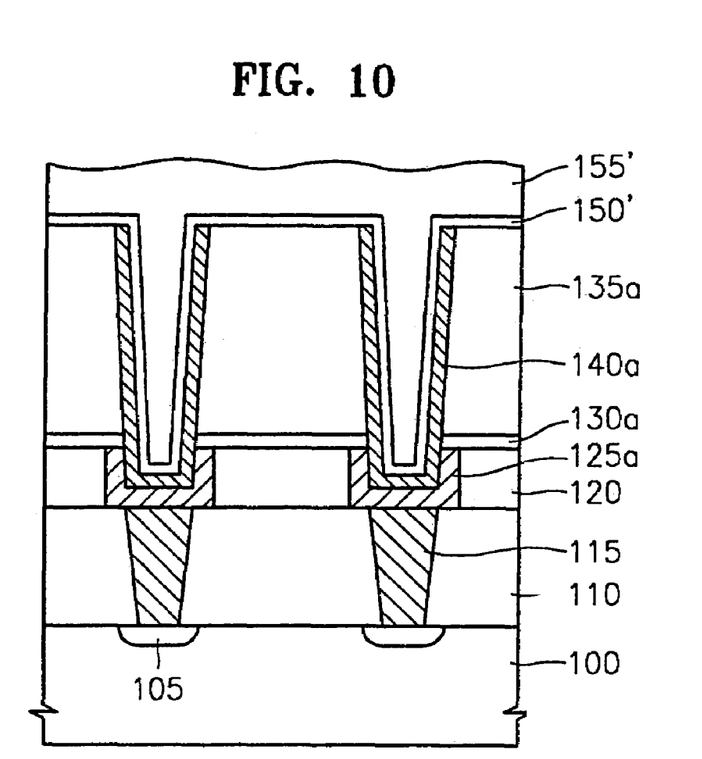
FIG. 10 is a schematic cross-sectional view illustrating a method for fabricating a semiconductor device according to another exemplary embodiment of the present invention.

FIG. 10 is a schematic cross-sectional view illustrating a method of fabricating a semiconductor device according to another exemplary embodiment of the present invention. In this exemplary embodiment, it is assumed that the initial fabrication steps include, e.g., those described above with respect to the method of FIGS. 1 through 6, or the method of FIGS. 1-3, 8 and 9.

However, in the exemplary embodiment depicted in FIG. 10, the resulting material of exposing an inner surface of the lower electrode 140a by removing the capping layer 145 via wet etching and leaving the third insulating layer pattern 135a intact, is used as a lower electrode having a concave structure. Then, a dielectric layer 150' and an upper electrode 155' are formed on the surface of the lower electrode 140a. The resulting structure provides more protection against collapse of the lower electrode 140a due to the support provided by the third insulating layer pattern 135a formed next to the lower electrode 140a.

Figure 11:
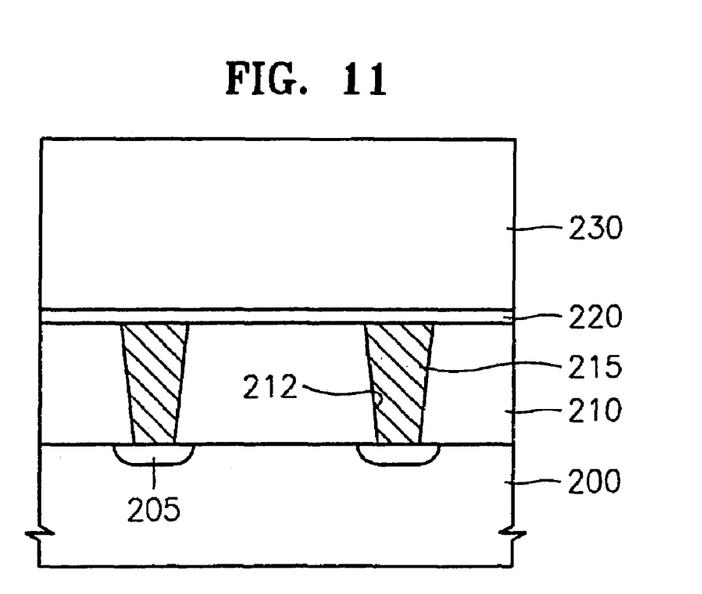
FIGS. 11 through 15 are schematic cross-sectional views illustrating a method for fabricating a semiconductor device according to another exemplary embodiment of the present invention.

FIGS. 11 through 15 are schematic cross-sectional views illustrating a method of fabricating a semiconductor device according to another exemplary embodiment of the present invention. Referring initially to FIG. 11, a first insulating layer 210 is formed on a semiconductor substrate 200 and contact holes 212 are formed by etching the first insulating layer 210. The first insulating layer 210 can be a BPSG layer, an SOG layer, a USG layer, a FOX layer, a silicon oxide layer using an HDP-CVD method, a TEOS layer, or an $SiH_4$ layer using plasma, for example. Then, doped polysilicon contact plugs 215 are formed in the contact holes 212, which contact impurity regions 205 on the semiconductor substrate 200. For example, an n-type doped polysilicon is formed by executing $PH_3$ doping on the polysilicon to secure low specific resistivity after performing polysilicon deposition using LPCVD. That is, in-situ doping simultaneously with the polysilicon deposition can be performed.

Next, an etch stop layer 220 and a second insulating layer 230 are sequentially formed on the contact plugs 215 and the first insulating layer 210. The etch stop layer 220 can be a BPSG layer, a PSG layer, a silicon oxide layer using HDP-CVD, or a TEOS layer using plasma. The second insulating layer 230 is used as a mold oxide layer.

Figure 12:
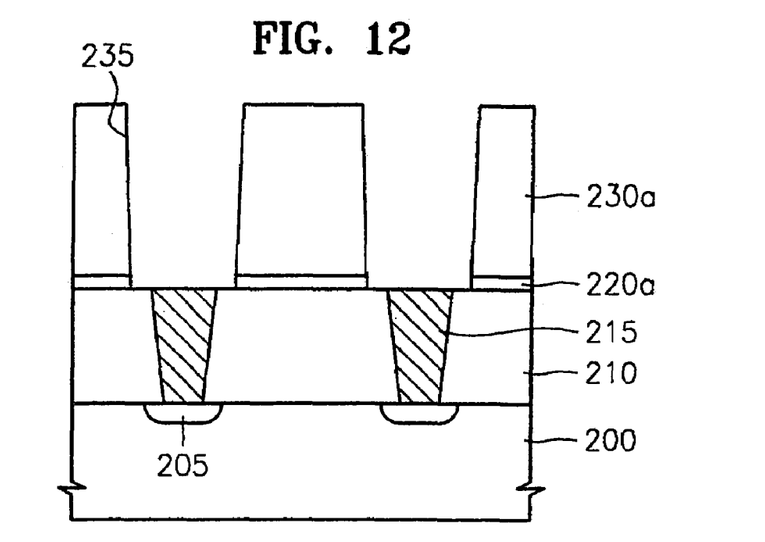

Referring now to FIG. 12, storage node holes 235 are formed to expose the contact plugs 215 by etching the second insulating layer 230 and the etch stop layer 220. First, a photoresist pattern or a polysilicon hard mask layer (not shown) is formed on the second insulating layer 230, and then a second insulating layer pattern 230a is formed by etching the second insulating layer 230 until an upper surface of the etch stop layer 220 is exposed. Next, the contact plugs 215 are exposed by performing an etch process to remove the exposed portions of the etch stop layer 220. The etch stop layer pattern 220a remains below the second insulating layer pattern 230a.

Figure 13:
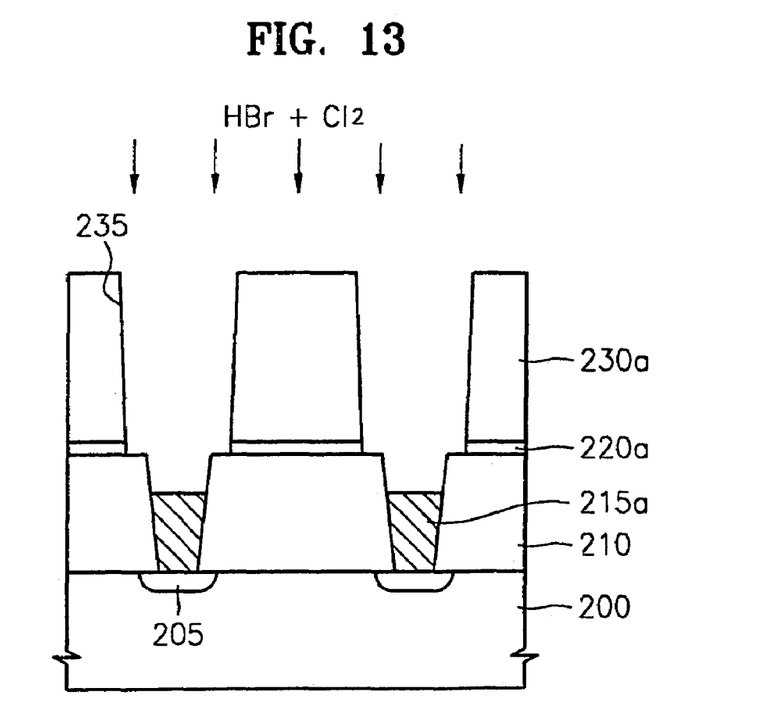

Referring now to FIG. 13, the exposed contact plugs 215 are selectively etched using a mixed gas of HBr and $Cl_2$ with Ar plasma, for example. In one exemplary embodiment of the invention, a flow rate of HBr ranges from about 10 to about 200 sccm, a flow rate of $Cl_2$ ranges from about 5 to about 50 sccm, and a flow rate of Ar ranges from about 10 to about 300 sccm. In addition, the plasma source power ranges from about 100 to about 1000 W and a bias power ranges from about 50 to about 300 W. The selectivity ratio of the contact plugs 215 to the second insulating layer pattern 230a or the etch stop layer pattern 220a is greater than about 10:1 and selective etching causes the contact plugs 215 to have an upper portion that is recessed. If a photoresist pattern is used in FIG. 12, the photoresist is removed using ashing and stripping methods. If a polysilicon hard mask is used in FIG. 12, the mask is simultaneously removed when the contact plugs 215 are selectively etched.

Figure 14:
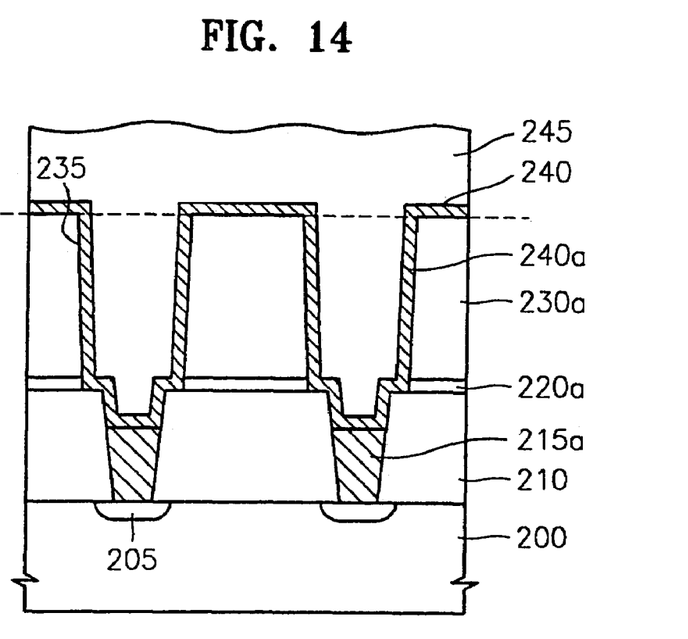

Referring now to FIG. 14, a conductive layer is conformally deposited to form a lower electrode 240 having a thickness that does not fully fill storage node holes 235 on selectively etched contact plugs 215a. Next, a capping layer 245 is formed to fill the storage node holes 235 on the lower electrode 240. An etch process (such as an etchback or CMP) is performed to etch the capping layer 245 and the lower electrode 240 to expose the upper surface of second insulating layer pattern 230a. If a polysilicon hard mask layer is used, etchback node separation, which is cheaper than CMP node separation, is used to obtain sufficient planarizing and complete separation. Then, each separated cylindrical lower electrode of capacitor 240a is formed.

Figure 15:
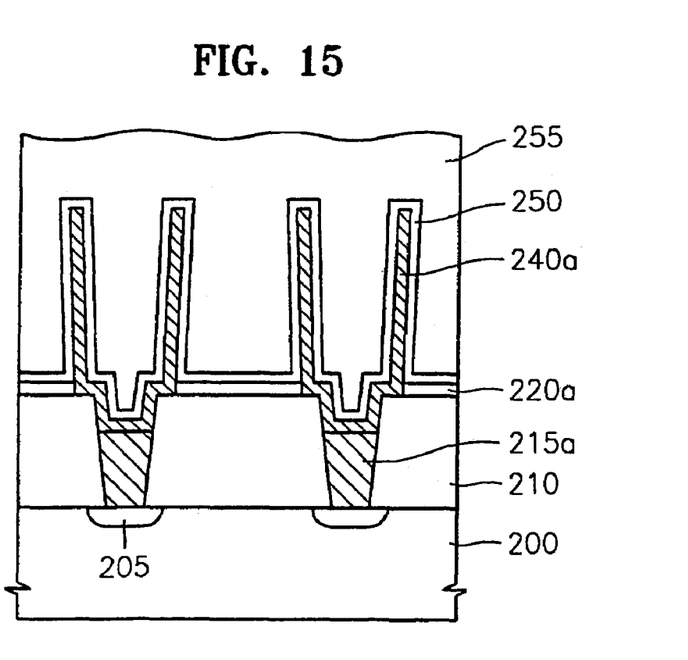

Referring now to FIG. 15, the second insulating layer pattern 230a and the capping layer 245 are removed using a wet etch process to expose the outer and inner surfaces of the cylindrical lower electrode 240a. A dielectric layer 250 is then conformally deposited over lower electrodes 240a and the etch stop pattern 220a. An upper electrode 255 is formed on the dielectric layer 250.

With this exemplary process, an increased capacitance can be achieved and tilting of the lower electrode can be prevented since the part where the contact plug is removed is used as the lower electrode of the capacitor by forming the lower electrode of the capacitor after selectively etching the contact plug.

In experiments by the inventors, after selectively etching the landing pad, a section of the etched landing pad was observed with a scanning electron microscope (SEM). In a case where the contact plug at the lower portion of the landing pad was made of doped polysilicon, the contact plug was found to be etched as the etching time of the landing pad was increased. However, it was found that virtually no damage occurred to nearby oxide or nitride structures/layers. These results indicate that a satisfactory selectivity ratio is obtained through the use of the mixed gas of $Cl_2$ and HBr with Ar plasma.

Furthermore, after etching the landing pad, the conductive layer for the lower electrode formed along the inner wall of the third hole was observed via SEM. It was found that sufficient step coverage resulted from using CVD or ALD. In addition, sufficient room was obtained for deposition of the dielectric layer and the upper electrode, where the landing pad was etched. Thus, these results indicate that the part where the landing pads are selectively etched can be used for capacitors.

Furthermore, for purposes of comparison, a structure having a cylindrical lower electrode with a height of 18000 Å was formed using a method of the present invention and a conventional method. As compared to the conventional method, a method of the present invention resulted in a reduction of the tilting of the bottom of the lower electrode up to about 70%.

As is evident from the exemplary embodiments described above, the present invention affords many advantages over conventional methods. For instance, as described above, the resistance against tilting of the lower electrode is increased since the lower portion of the lower electrode is placed in the landing pad or the contact plug, and the etch stop layer supports the lower electrode at a location higher than the bottom of the lower electrode. Therefore, in comparison to a conventional process, the height of an OCS structure can be increased to provide increased capacitance, since tilting of the lower electrode is lessened when forming the OCS structure.

Furthermore, the present invention prevents formation of bridges that result from collapse of the lower electrode. That is, methods of the present invention prevent lower electrodes from breaking off or collapsing during subsequent processes, and properly patterned lower electrodes are obtained. Indeed, damage to the lower electrodes is prevented by maintaining the structural integrity and physical strength for the lower electrodes. Accordingly, methods of the invention provide an increase in the electrical performance and yield of semiconductor devices and reduce or eliminate the potential for capacitor breakdown.

In addition, in contrast to conventional methods, the present invention can provide increased capacitance without having to increase the height of the OCS because the part where the landing pad or the contact plug is selectively etched can be used to increase the effective area of the electrode. Indeed, an increase in capacitance can be obtained by changing the depth and the etching amount of the storage node contact plug, for example.

Moreover, when etching the landing pad or the contact plug using $Cl_2$ and HBr with a condition that the selectivity ratio of polysilicon to one of the silicon oxide or nitride layer is satisfactorily high, methods of the present invention can be applied without an OCS or a lower structure.

Another advantage of the invention is that increased integration results from use of a polysilicon hard mask instead of a photoresist pattern, which makes it possible for the polysilicon hard mask to be removed simultaneously with etching the landing pad or the contact plug. Therefore, the overall process can be simplified by using an etchback node separation process, rather than CMP node separation, which can cause a problem with the use of polysilicon hard mask.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device, the method comprising:
    forming a first insulating layer on a semiconductor substrate;
    forming a contact hole in the first insulating layer;
    forming a contact plug with doped polysilicon in the contact hole;
    forming an etch stop layer on the contact plug and the first insulating layer;
    forming a second insulating layer on the etch stop layer;
    forming a storage node hole through the second insulating layer and the etch stop layer to expose the contact plug;
    selectively etching the exposed contact plug using a mixture of HBr and $Cl_2$, and Ar plasma;
    forming a lower electrode on the selectively etched contact plug; and
    forming a capacitor by forming a dielectric layer and an upper electrode on the lower electrode.

2. The method of claim 1, further comprising removing the second insulating layer prior to forming the dielectric layer and upper electrode.

3. The method of claim 1, wherein selectively etching the exposed contact plug is performed with a selectivity ratio of the contact plug to one of the second insulating layer and the etch stop layer, which is greater than about 10:1.

4. The method of claim 1, wherein the flow rate of HBr ranges from about 10 to about 200 sccm, the flow rate of $Cl_2$ ranges from about 5 to about 50 sccm, and the flow rate of Ar ranges from about 10 to about 300 sccm, and wherein a plasma source power ranges from about 100 to about 1000 W and a bias power ranges from about 50 to about 300 W.

5. The method of claim 1, wherein forming the storage node hole comprises:
    forming a polysilicon hard mask on the second insulating layer; and
    etching the second insulating layer and the etch stop layer using the polysilicon hard mask to expose the contact plug.

6. The method of claim 5, further comprising removing the polysilicon hard mask while selectively etching the exposed contact plug.

7. The method of claim 1, wherein forming a contact plug with doped polysilicon in the contact hole comprises performing in-situ doping while depositing polysilicon.

8. The method of claim 1, wherein forming a lower electrode on the selectively etched contact plug comprises:
    forming a conformal conductive layer for the lower electrode, which covers the exposed surfaces of the first and second insulation layers and the selectively etched contact plug;
    forming a capping layer on the conformal conductive layer to fill the storage node hole;
    planarizing the capping layer and conformal conductive layer to expose an upper surface of the second insulating layer; and
    forming a cylindrical lower electrode by removing the second insulating layer and the capping layer.

* * * * *